United States Patent [19]
Ozaki, et al.

[11] Patent Number: 4,721,904
[45] Date of Patent: Jan. 26, 1988

[54] DIGITAL PHASE DIFFERENCE DETECTING CIRCUIT

[75] Inventors: Hidetoshi Ozaki, Chofu, Kaoru Kobayashi, Yokohama, both of Japan

[73] Assignees: Victor Company of Japan, Ltd., Yokohama, Japan

[21] Appl. No.: 810,067

[22] Filed: Dec. 17, 1985

[30] Foreign Application Priority Data

Dec. 25, 1984 [JP] Japan ............................. 59-281703
Dec. 25, 1984 [JP] Japan ............................. 59-281704
Dec. 25, 1984 [JP] Japan ............................. 59-201613

[51] Int. Cl.$^4$ ............................................ G01R 25/00
[52] U.S. Cl. .................................. 324/83 R; 328/133
[58] Field of Search ............... 324/83 R, 83 A, 83 D, 324/83 FE, 86; 307/262; 328/133, 155; 323/213, 241

[56] References Cited

U.S. PATENT DOCUMENTS 4,307,346 12/1981 Kurosawa ........................ 328/155

*Primary Examiner*—Michael J. Tokar
*Attorney, Agent, or Firm*—Ladas & Parry

[57] ABSTRACT

A digital phase difference detecting circuit has a phase shifting circuit for shifting by +90° or −90° a phase of an input signal which has been sampled over a predetermined sampling period, a dividing circuit for dividing an output signal of the phase shifting circuit by the input signal, an operation circuit for performing an inverse trigonometric function operation on an output signal of the dividing circuit, and a subtracting circuit for obtaining the difference between an output signal of the operation circuit and a phase of a reference signal. The resulting output signal of the subtracting circuit indicates the phase difference between the reference signal and the input signal.

12 Claims, 8 Drawing Figures

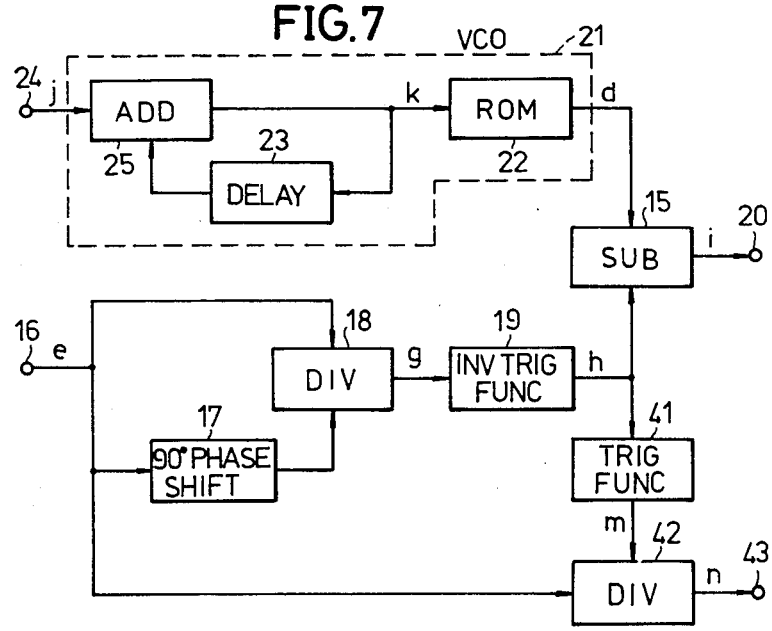
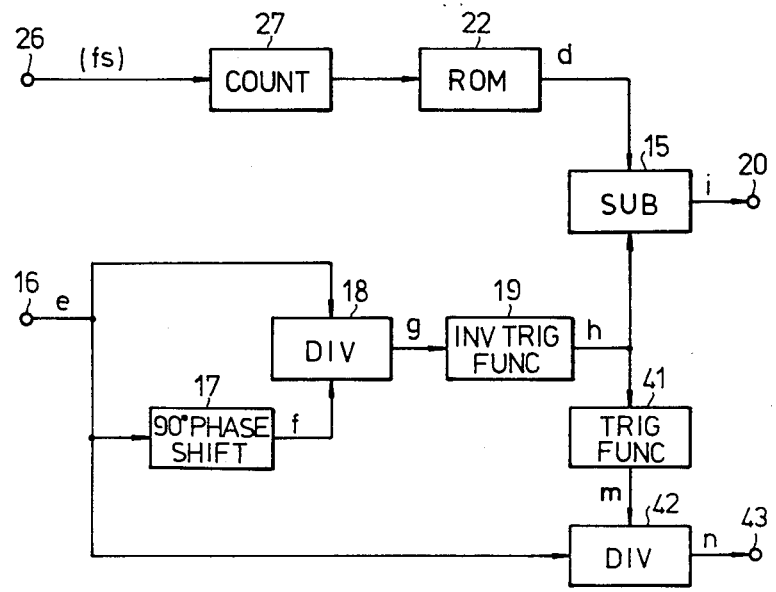

DIGITAL PHASE DIFFERENCE DETECTING CIRCUIT

BACKGROUND OF THE INVENTION

The present invention relates, generally, to digital phase difference detecting circuits and, more particularly, to a digital phase difference detecting circuit which detects a phase difference between an input signal and a reference signal at high speed.

A phase difference between an input signal and a reference signal is obtained in various kinds of signal processing. An analog or digital circuit which detects phase difference generally has a multiplier. However, the linearity of the phase difference output of such a phase comparing circuit is poor; the phase difference output becomes distorted in the form of a sinusoidal curve. An analog phase comparing circuit is easily affected changes in the ambient temperature and the lapse of time, and it is difficult to manufacture as an integrated circuit. Such problems do not occur in a digital phase comparing circuit.

However, with a digital phase comparing circuit, when the input signal includes an amplitude modulated signal component, the amplitude modulated signal component appears in its phase difference output. Hence, in this case, there is a serious disadvantage in that it is impossible to detect a phase difference between the input signal and the reference signal accurately.

SUMMARY OF THE INVENTION

Accordingly, it is a general object of the present invention to provide a novel and useful digital phase difference detecting circuit in which the disadvantages described heretofore are eliminated.

The invention is a digital phase difference detecting circuit having a phase shifter for shifting the phase of an input signal which has been sampled over a predetermined sampling period by $+90°$ or $-90°$, a first divider for dividing the output signal of the phase shifter by the input signal, a first operator for performing an inverse trigonometric-function operation on the output signal of the first divider, and a subtractor for obtaining the difference between the output signal of the first operator and the phase of a reference signal. As a result, it is possible to detect the phase difference between the input signal accurately, and the reference signal even when the input signal includes an amplitude-modulated signal component. In addition, the phase difference can be detected quickly compared to a phase difference detected by analog signal processing. Moreover, the digital phase difference detecting circuit according to the present invention is unaffected by a change in the ambient temperature, lapse of time and the like, and the circuit can easily be integrated. Further, it is possible to detect the phase difference positively, even when the number of waves of the input signal is small, and the linearity of the phase-difference output signal is satisfactory. Even when the input signal is a color burst signal obtained by sampling a carrier chrominance signal over a predetermined sampling period, it is possible to obtain an output signal from the subtractor for automatic phase control in an automatic phase control circuit.

Still another object of the present invention is to provide a digital phase difference detecting circuit which further has, in addition to the above, a second operator for performing a trigonometric function operation on the output signal of the first operator and a second divider for dividing an output signal of the second operator by the input signal for detecting an envelope of the input signal. According to the digital phase difference detecting circuit of the present invention, it is possible to detect the envelope of the input signal quickly, by using the output signal of the first operator, and with a simple circuit. If the input signal is the color burst signal, it is possible to obtain an automatic chroma control signal from the second divider for use in an automatic chroma control circuit. If, however, the input signal is an amplitude modulated signal, it is possible to demodulate the amplitude modulated signal with the second divider.

Other objects and further features of the present invention will be apparent from the following detailed description when read in conjunction with the accompanying drawings.

BRIEF DESCRIPTION OF THE DRAWINGS

FIG. 7 is a system block diagram showing a fourth embodiment of the digital phase difference detecting circuit according to the present invention; and FIG. 8 is a system block diagram showing a fifth embodiment of the digital phase difference detecting circuit according to the present invention.

DETAILED DESCRIPTION

Figure 1:
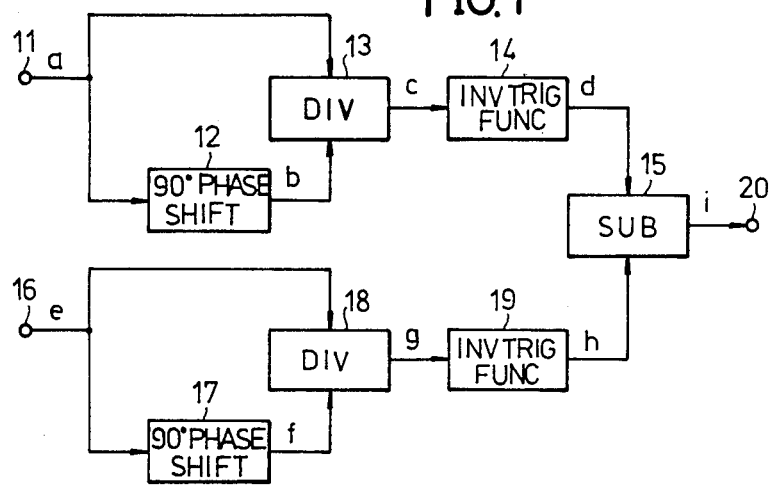
FIG. 1 is a system block diagram showing a first embodiment of the digital phase difference detecting circuit according to the present invention.

FIG. 1 shows the first embodiment of the digital phase difference detecting circuit according to the present invention. A digital reference signal $a_1$ describing a function $A \sin(2\pi f_c t + \theta_1)$ is applied to an input terminal 11. In the function, A represents the amplitude, $f_c$ represents the frequency, and $\theta_1$ represents the phase. The reference signal $a_1$ is a digital signal which has been sampled over a predetermined sampling period. The reference signal $a_1$ is passed through a 90° phase shifting circuit 12 and supplied to a dividing circuit 13, and supplied directly to the dividing circuit 13. The 90° phase shifting circuit 12 shifts the phase of the reference signal $a_1$ by 90° and supplies a signal b describing a function $A \cos(2\pi f_c t + \theta_1)$ to the dividing circuit 13. Hence, the dividing circuit 13 generates a signal c describing a/b or a function $\tan(2\pi f_c t + \theta_1)$ and supplies this signal c to an inverse trigonometric function operation circuit 14. The inverse trigonometric function operation circuit 14 performs an operation $\tan^{-1} c$ and generates a signal d describing a function $2\pi f_c t + \theta_1$. This signal d is supplied to a subtracting circuit 15.

A digital input signal e describing a function $B \sin(2\pi f_c t + \theta_2)$ is applied to an input terminal 16. In the function, B represents the amplitude, fc represents the frequency, and $\theta_2$ represents the phase. The input signal e is also a digital signal which has been sampled over a predetermined sampling period. The input signal e is passed through a 90° phase shifting circuit 17 and supplied to a dividing circuit 18, and supplied directly to the dividing circuit 18. The 90° phase shifting circuit 17 shifts the phase of the input signal e by 90° and supplies to the dividing circuit 18 a signal f describing a function B cos $(2\pi fct + \theta_2)$. Hence, the dividing circuit 18 generates a signal g describing e/f or a function tan $(2\pi fct + \theta_2)$ and supplies this signal g to an inverse trigonometric function operation circuit 19. The inverse trigonometric function operation circuit 19 performs an operation $\tan^{-1}g$ and generates a signal h describing a function $2\pi fct + \theta_2$. This signal h is supplied to the subtracting circuit 15.

The subtracting circuit 15 obtains a difference, from d-h, from the signals d and h, and supplies a signal i describing a function $\theta_1 - \theta_2$ to an output terminal 20 as a phase difference output signal.

It is possible to use -90° phase shifting circuits, which shift the phase by -90°, instead of the 90° phase shifting circuits 12 and 17. In this case, the inverse trigonometric function operation circuits 14 and 19 should be designed to perform operations $-\tan^{-1}c$ and $-\tan^{-1}g$, respectively.

In addition, it is possible to use dividing circuits which respectively perform divisions $b/a_1$ and f/e instead of the dividing circuits 13 and 18. In this case, the inverse trigonometric function operation circuits 14 and 19 should be designed to perform operations $\cot^{-1}c$ and $\cot^{-1}g$, respectively.

Figure 2:
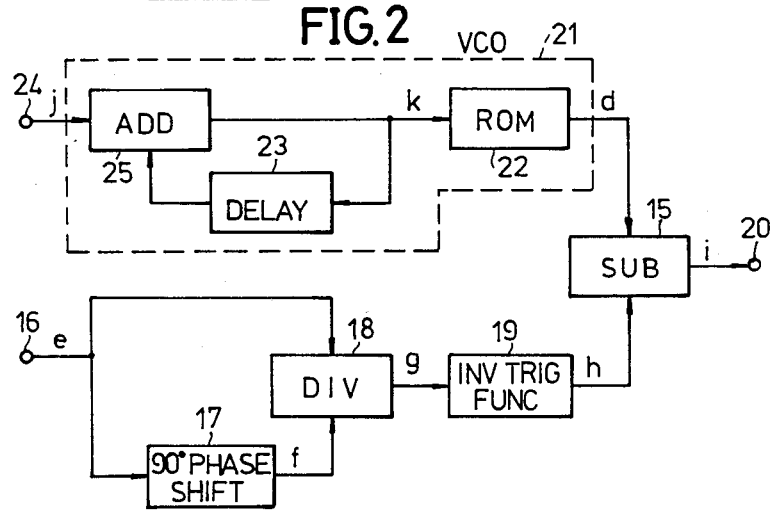
FIG. 2 is a system block diagram showing a second embodiment of the digital phase difference detecting circuit according to the present invention.
Figure 3:
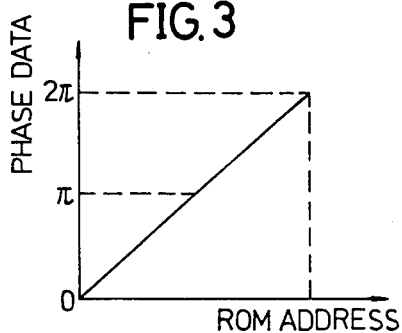
FIG. 3 shows phase data stored in a read only memory (ROM) within the block system shown in FIG. 2 in correspondence with addresses in the ROM.

FIG. 2 shows the second embodiment of the digital phase difference detecting circuit according to the present invention. In FIG. 2, those parts which are the same as those corresponding parts are designated by the same reference numerals, and description thereof will be omitted. In FIG. 2, a type of voltage controlled oscillator (VCO) 21 comprising a read only memory (ROM) 22 is used as a reference signal source. Phase data shown in FIG. 3 are stored in the ROM 22 in correspondence with addresses in the ROM 22. A 1-clock delay circuit 23 is driven by a clock signal which is the same as a sampling clock signal used when performing the sampling to obtain the input signal e.

Figure 4:
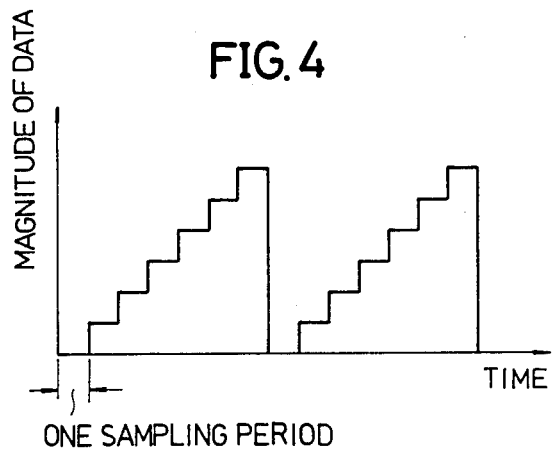
FIG. 4 shows magnitudes of data of a ROM address control signal obtained from an adder within the block system shown in FIG. 2.

Data j in accordance with the oscillation frequency of the reference signal which is to be generated are applied to an input terminal 24. The data j are supplied to an adder 25, and an output signal of the adder 25 is delayed in the delay circuit 23 and then supplied to the adder 25. In other words, the adder 25 and the delay circuit 23 constitute a circuit for generating a ROM address control signal. The adder 25 supplies the ROM address control signal k to the ROM 22. The adder 25 adds the data j from the input terminal 24 and the delayed data from the delay circuit 23 for every one sampling period, but since the bit length of the adder 25 is finite, the adder 25 overflows after a specific period. Accordingly, the magnitude of the data of the ROM address control signal k changes as shown in FIG. 4.

When the ROM address control signal k is supplied to the ROM 22, a read-out address of the ROM 22 is successively renewed according to the clock signal, and a phase datum out of phase data of zero to $2\pi$ (a datum out of a function table), that is, a signal identical to the output signal d (describing the function $2\pi fct + \theta_1$) of the inverse trigonometric function operation circuit 14 shown in FIG. 1 is read out from the ROM 22 and is supplied to the subtracting circuit 15. As a result, similarly as in the case of the first embodiment described before, the phase difference $\theta_1 - \theta_2$ between the reference signal $a_1$ and the input signal e is obtained from the subtracting circuit 15.

Figure 5:
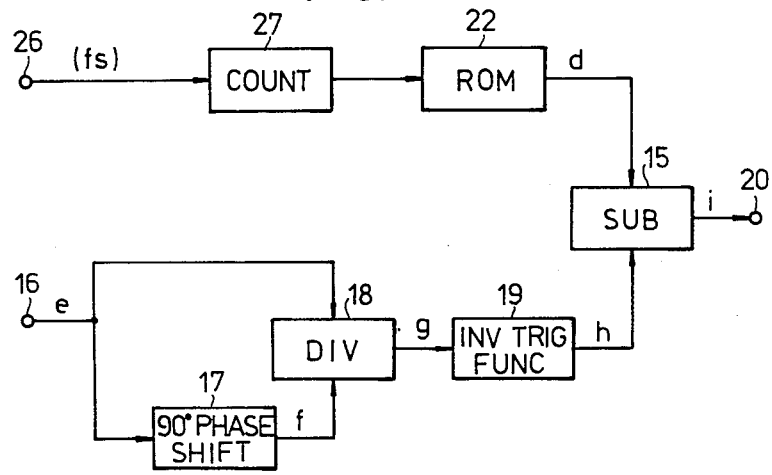
FIG. 5 is a system block diagram showing a third embodiment of the digital phase difference detecting circuit according to the present invention.

FIG. 5 shows the third embodiment of the digital phase difference detecting circuit according to the present invention. In FIG. 5, those parts which are the same as those corresponding parts in FIG. 2 are designated by the same reference numerals, and description thereof will be omitted. In the present embodiment, it will be assumed that an equation fs=Nfc stands between the signal frequency fc and a sampling frequency fs, where N is an integer greater than or equal to three.

A clock signal having the sampling frequency fs is applied to an input terminal 26. A counter 27 is designed to repeat an operation of counting N clock pulses in the clock signal. A counted value in the counter 27 is supplied to the ROM 22. Accordingly, the read-out address of the ROM 22 is renewed for every N-count, and a phase datum out of the phase data of zero to $2\pi$ is read out from the ROM 22 and is supplied to the subtracting circuit 15. As a result, similarly as in the cases of the embodiments described before, the phase difference $\theta_1 - \theta_2$ between the reference signal $a_1$ and the input signal e is obtained from the subtracting circuit 15.

In the case where an equation fs=4Mfc stands between the signal frequency fc and the sampling frequency fs, where M is an integer greater than or equal to one, an M-clock delay circuit for delaying the input signal e by M clock pulses of the clock signal may be used for the 90° phase shifting circuit 17 shown in FIGS. 1, 2, and 5.

Hilbert filters may be used for the 90° phase shifting circuits 12 and 17.

Circuits such as the 90° phase shifting circuits 12 and 17, the dividing circuits 13 and 18, the subtracting circuit 15, the inverse trigonometric function operation circuits 14 and 19, and the delay circuit 23 may be constituted by a circuit which comprises a ROM stored with a function table and carries out the operation of a specific circuit by reading out desired data from the ROM.

Next, description will be given with respect to a case where the input signal e is a color burst signal. The color burst signal may be obtained from a circuit shown in FIG. 6, for example. A carrier chrominance signal is applied to an input terminal 31, and a burst gate pulse is applied to an input terminal 32. A switching circuit 33 is turned ON by the burst gate pulse, and thus, only the color burst signal within the carrier chrominance signal is extracted and supplied to an output terminal 34. The color burst signal from the output terminal 34 is applied to the input terminal 16 in FIG. 1, 2, or 5 as the input signal e. In this case, the signal i obtained from the output terminal 20 indicates a phase difference between the reference signal and the color burst signal. For this reason, the signal i can be used as an automatic phase control (APC) signal for use in an automatic phase control (APC) circuit (not shown) which automatically adjusts the phase of the carrier chrominance signal.

FIG. 7 shows the fourth embodiment of the digital phase difference detecting circuit according to the present invention. In FIG. 7, those parts which are the same as those corresponding parts in FIG. 2 are designated by the same reference numerals, and description thereof will be omitted. The output signal h of the inverse trigonometric function operation circuit 19 is also supplied to a trigonometric function operation circuit 41. The trigonometric function operation circuit 41 performs an operation sin h and generates a signal m describing a function sin $(2\pi fct + \theta_2)$. This signal m is supplied to a dividing circuit 42. The dividing circuit 42 performs a division described by n=e/m and supplies to an output terminal 43 a signal n describing B. As described before, B represents the amplitude of the input signal e. Hence, in the case where the input signal e is the color burst signal, the signal n can be used as an automatic chroma control (ACC) signal for use in an automatic chroma control (ACC) circuit (not shown) which automatically adjusts the saturation of the carrier chrominance signal.

On the other hand, in the case where the input signal e is an amplitude modulated (AM) signal, the input signal e describes a function $C[1+DV(t)]$ sin $(2\pi fct)$, where C represents the amplitude of the carrier, D represents the amplitude modulation factor, V(t) represents the modulating signal, and fc represents the frequency of the carrier. In this case, the output signal f of the 90° phase shifting circuit 17 describes a function $C[1+DV(t)]$ cos $(2\pi fct)$. The output signal g of the dividing circuit 18 describes a function tan $(2\pi fct)$, and the output signal h of the inverse trigonometric function operation circuit 19 describes a function $2\pi fct$. Accordingly, the output signal m of the trigonometric function operation circuit 41 describes a function sin h or sin $(2\pi fct)$, and the output signal n of the dividing circuit 42 describes e/m or a function $C[1+DV(t)]$. Because C represents the amplitude of the carrier and is constant, n describes a function $1+DV(t)$ when it is assumed that C=1. In the equation $1+DV(t)$, the first term "1" is a D.C. component. Therefore, an AM signal component having the D.C. component added thereon, that is, an envelope of the input AM signal e, is obtained from the output terminal 43. In other words, a demodulated output of the input AM signal e is obtained from the output terminal 43.

Hence, according to the present embodiment, it is possible to detect the envelope of the input signal e by use of the output signal h of the inverse trigonometric function operation circuit 19, with the use of a simple circuit.

Figure 6:
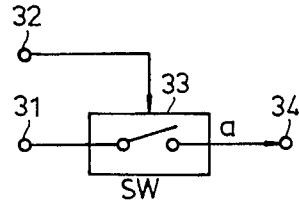
FIG. 6 shows a circuit for extracting a color burst signal from a carrier chrominance signal.

FIG. 8 shows the fifth embodiment of the digital phase difference detecting circuit according to the present invention. In FIG. 8, those parts which are the same as those corresponding parts in FIGS. 5 and 6 are designated by the same reference numerals, and description thereof will be omitted. In the present embodiment, substantially the same results are obtained as in the case of the fourth embodiment described before.

Next description will be given with respect to the case where the input signal e includes an AM signal component. For example, it will be assumed for convenience' sake that the input signal e describes a function $E[1+F \cos \theta_3(t)] \cos \theta_2(t)$ and the reference signal $a_1$ describes a function $G \sin \theta_1(t)$. The conventional phase comparing circuit comprising the multiplier obtains the phase difference output by performing the following operation.

$E[1 + F\cos\theta_3(t)]\cos\theta_2(t) \times G\sin\theta_1(t) =$ $(EG/2)[1 + F\cos\theta_3(t)]\sin[\theta_2(t) + \theta_1(t)] -$ $(EG/2)[1 + F\cos\theta_3(t)]\sin[\theta_2(t) - \theta_1(t)]$ As is clear from the above multiplication result, the AM signal component of the input signal e appears in the phase difference output.

On the other hand, according to the digital phase difference detecting circuit of the present invention, the output signal d of the inverse trigonometric function operation circuit 14 (or the ROM 22) describes a function $\tan^{-1}c$ or $\tan^{-1}(a_1/b)$ in the described embodiments. Hence, d describes a function $\tan^{-1}[G \sin \theta_1(t)]/[G \cos \theta_1(t)] = \theta_1(t)$. In addition, the output signal h of the inverse trigonometric function operation circuit 19 describes a function $\tan^{-1} g$ or $\tan^{-1} (e/f)$ in the described embodiments, but as described before, the signal h may describe a function $-\tan^{-1} g$ or $-\tan^{-1} (f/e)$. In this case, $h = -\tan^{-1} -E[1+F \cos \theta_3(t)] \sin \theta_2(t)/E[1+F \cos \theta_3(t)] \cos \theta_2(t) = -[-\theta_2(t)] = \theta_2(t)$. Accordingly, a phase difference output i describing a function $\theta_1(t) - \theta_2(t)$ is obtained from the subtracting circuit 20. Therefore, the AM signal component of the input signal e is not included in the phase error output, and it is possible to accurately obtain the phase error output.

Further, the present invention is not limited to these embodiments, but various variations and modifications may be made without departing from the scope of the present invention.

What is claimed is:

1. A digital phase difference detecting circuit comprising:
   first phase shifting means for shifting by +90° or −90° a phase of an input signal which has been sampled with a predetermined sampling period;
   first dividing means for performing a division with an output signal of said first phase shifting means and said input signal;
   first operation means for performing an inverse trigonometric function operation on an output signal of said first dividing means; and
   subtracting means for obtaining a difference between an output signal of said operation means and a phase of a reference signal so as to obtain a phase difference between said reference signal and said input signal.

2. A digital phase difference detecting circuit as claimed in claim 1 in which said reference signal has been sampled with a predetermined sampling period, said digital phase difference detecting circuit further comprising second phase shifting means for shifting the phase of the reference signal by +90° or −90°, second dividing means for performing a division with an output signal of said second phase shifting means and said reference signal, and second operation means for performing an inverse trigonometric operation on an output signal of said second dividing means, said second operation means supplying an output signal thereof to said subtracting means as the phase of said reference signal.

3. A digital phase difference detecting circuit as claimed in claim 1 which further comprises memory means stored with phase data which linearly vary from zero to $2\pi$ depending on addresses thereof, and address generating means for generating an address signal which varies monotonously with a specific period, a phase datum which is read out from a read-out address in said memory means designated by an output address signal of said address generating means being supplied to said subtracting means as the phase of said reference signal.

4. A digital phase difference detecting circuit as claimed in claim 3 in which said address generating means comprises adding means supplied with predetermined data in accordance with an oscillation frequency of said reference signal, and delay means for delaying an output signal of said adding means by said predetermined sampling period, said adding means adding said predetermined data and an output signal of said delay means, an output signal of said adding means being supplied to said memory means as said address signal.

5. A digital phase difference detecting circuit as claimed in claim 3 in which an equation $fs=Nfc$ stands, where fc represents a frequency of said reference signal, fs represents a sampling frequency, and N is an integer greater than or equal to three, said address generating means comprising a counter which repeats an operation of counting N pulses of a signal having said sampling frequency fs, said counter supplying an output thereof to said memory means as said address signal.

6. A digital phase difference detecting circuit as claimed in claim 3 in which said memory means comprises a read only memory.

7. A digital phase difference detecting circuit as claimed in claim 3 which further comprises second operation means for performing a trigonometric operation on the output signal of said first operation means, and second dividing means for performing a division with an output signal of said second operation means and said input signal, said second dividing means producing an envelope detection signal of said input signal.

8. A digital phase difference detecting circuit as claimed in claim 7 in which said input signal is a color burst signal of a carrier chrominance signal, said subtracting means producing an output signal thereof as an automatic phase control signal which is used for automatically adjusting a phase of the carrier chrominance signal, said second dividing means producing the output envelope detection signal thereof as an automatic chroma control signal for automatically controlling a saturation of the carrier chrominance signal.

9. A digital phase difference detecting circuit as claimed in claim 7 in which said input signal is an amplitude modulated signal, said second dividing means producing the output envelope detection signal thereof as a demodulated output of said amplitude modulated signal.

10. A digital phase difference detecting circuit as claimed in claim 1 in which an equation $fs=4Mfc$ stands, where fc represents a frequency of the reference signal, fs represents a sampling frequency, and M is an integer greater than or equal to one, said first phase shifting means comprising delay means for delaying said input signal by a time period which is M times said sampling period.

11. A digital phase difference detecting circuit as claimed in claim 1 in which said first dividing means produces a signal g describing a function e/g, where e represents said input signal and f represents the output signal of said first phase shifting means, said first operation means producing a signal h describing a function $\tan^{-1} g$.

12. A digital phase difference detecting circuit as claimed in claim 1 in which said first phase shifting means, said first dividing means, said first operation means, and said subtracting means respectively perform a specific operation by use of a function table stored in a read only memory.

* * * * *